Dec. 24, 1968 J. M. MARTINELL 3,418,535

INTERCONNECTION MATRIX FOR DUAL-IN-LINE PACKAGES

Filed Jan. 23, 1967 2 Sheets-Sheet 1

INVENTOR

JOHN MARTINELL

BY Donald M. Sandler

ATTORNEY

Dec. 24, 1968 J. M. MARTINELL 3,418,535

INTERCONNECTION MATRIX FOR DUAL-IN-LINE PACKAGES

Filed Jan. 23, 1967 2 Sheets-Sheet 2

INVENTOR
JOHN MARTINELL
BY Donald M Sandler
ATTORNEY

United States Patent Office 3,418,535
Patented Dec. 24, 1968

3,418,535
INTERCONNECTION MATRIX FOR DUAL-IN-LINE PACKAGES

John M. Martinell, Delaware County, Pa., assignor to Elco Corporation, Willow Grove, Pa., a corporation of Delaware Filed Jan. 23, 1967, Ser. No. 611,104
8 Claims. (Cl. 317—101)

ABSTRACT OF THE DISCLOSURE

An interconnection matrix for a dual-in-line package which has its leads arranged in two parallel rows, includes overlying flat, conductive ribbon separated by a nonconductive strip. Projections, integral and coplanar with the ribbon extend transversely therefrom and terminate adjacent particular leads in apertured tabs through which the respective leads pass.

This invention relates to an interconnection matrix that is ideally suitable for interconnecting the leads of dual-in-line packages (D-I-P's) containing integrated circuits.

A dual-in-line package is one in which an integrated circuit wafer is encapsulated in a body that is generally parallelepiped in shape with dimensions of approximately ⅛" x ¼" x ¾", and each has either 14 or 16 leads on 0.100" centers arranged in two parallel rows at opposite longitudinal sides of the body of the package. These leads, where they exit from the ceramic body of the package are generally rectangular about 0.060" x 0.012"; and a short distance from the body, the leads are reduced in size to about 0.022" x 0.012". Consequently, the dual-in-line package permits the tiny, difficult to handle integrated circuit wafer contained therein, to be handled easily, manually, as well as automatically, and provides leads connected to the encapsulated wafer which are strong enough to permit the package to be mounted directly into a socket or on a non-conductive mounting board that has two rows of apertures spaced to match the spacing of the leads on the package.

While the volumetric size of dual-in-line packages greatly facilitates their handling and permits them to be mounted directly into a printed circuit board or plugged into a special socket, this approach to packaging a complete circuit involving many dual-in-line packages, has to date, utilized only the conventional methods of making internal and external interconnections. Internal connections are considered to be those connections between one lead of a given dual-in-line package and another lead of the same package; and external connections are considered to be those connections between a lead of a given dual-in-line package and some other circuit such as, for example, a power supply or the lead of another package.

Internal and external interconnections using dual-in-line packages are conventionally achieved by using two-sided printed circuit boards, back-panel wiring or combinations of these techniques. This approach to making interconnections is likely to result in a low density overall package with a significant volume of the package required for making interconnections. It is, therefore, the primary object of the present invention to increase the volumetric efficiency of the interconnections and thus increase the density of an electronic circuit package made up of a plurality of dual-in-line packages, although, in its broadest sense, the invention is applicable to any situation wherein parallel rows of conductors are to be interconnected.

Briefly, the invention involves aligning a group of D-I-P's so that their leads are arranged in two parallel rows, and positioning an interconnection matrix between the leads of the D-I-P's. The matrix is in the form of one or more planar strips of conductors and insulators of such thickness that many layers are required to build up a thickness equal to the lead length, the planes of the strips being perpendicular to the leads. The conductive strip is in the form of a relatively narrow ribbon that may extend the entire length of the leads (e.g., the length of the group of aligned D-I-P's). A given conductive strip is used to connect any one of the leads on any one of the D-I-P's to any number of other leads on the same or any other of the D-I-P's of the group by providing each ribbon with integral transverse projections that are located at longitudinal places along the ribbon aligned with the leads to be interconnected by the strip. The free end of each transverse projection is provided with an apertured tab that is coplanar with the transverse projection and the free end of a lead. In this manner, all of the internal and external connections of the group of D-I-P's can be achieved with the interconnection matrix. The volume of such matrix is of the same order of magntiude as the volume of the bodies of the D-I-P's in the group that are connected by the matrix, and hence the present invention will increase the density of packaging as compared to the conventional approaches, and will also speed-up the process of mounting and interconnecting a group of D-I-P's.

The more important features of this invention have thus been outlined rather broadly in order that the detailed description thereof that follows may be better understood, and in order that the contribution to the art may be better appreciated. There are, of course, additional features of the invention that will be described hereinafter and which will also form the subject of the claims appended hereto. Those skilled in the art will appreciate that the conception upon which this disclosure is based may readily be utilized as a basis for designing other structures for carrying out the several purposes of this invention. It is important, therefore, that the claims to be granted herein shall be of sufficient breadth to prevent the appropriation of this invention by those skilled in the art.

Other objects of the invention and its many attendant advantages will be readily appreciated as the invention becomes better understood with reference to the following detailed description when considered in connection with the accompanying drawing, wherein.

Figures 1, 2, 5:
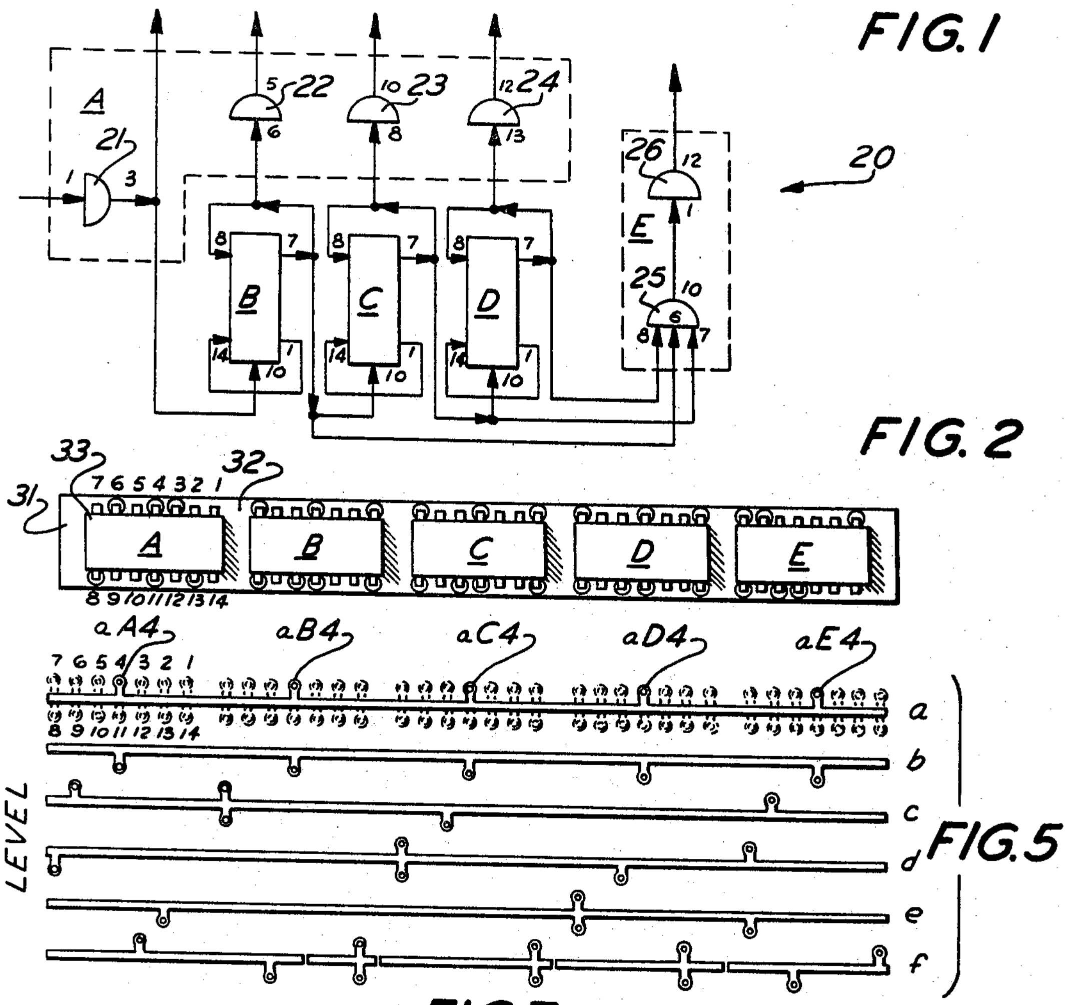
FIG. 1 is a block diagram showing a typical logic circuit.
FIG. 2 is a plan view of a number of dual-in-line packages mounted on a rigid board for defining a completed module.
Figures 4, 4A, 6, 7, 9:
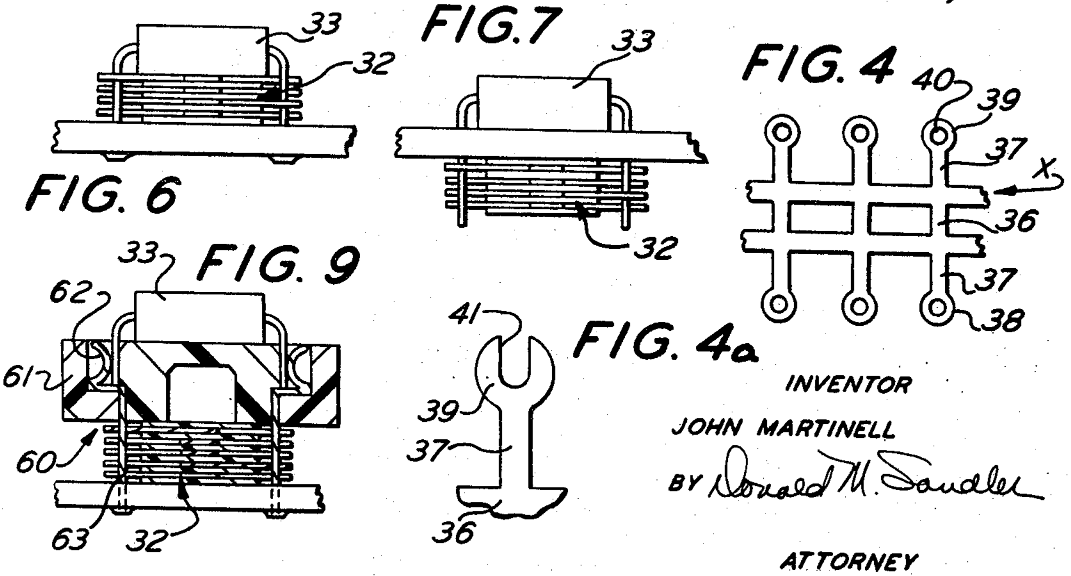
FIG. 4 is a plan view of a metallic comb capable of making all the possible interconnections between the leads of one or more dual-in-line packages.
Figures 3, 8:
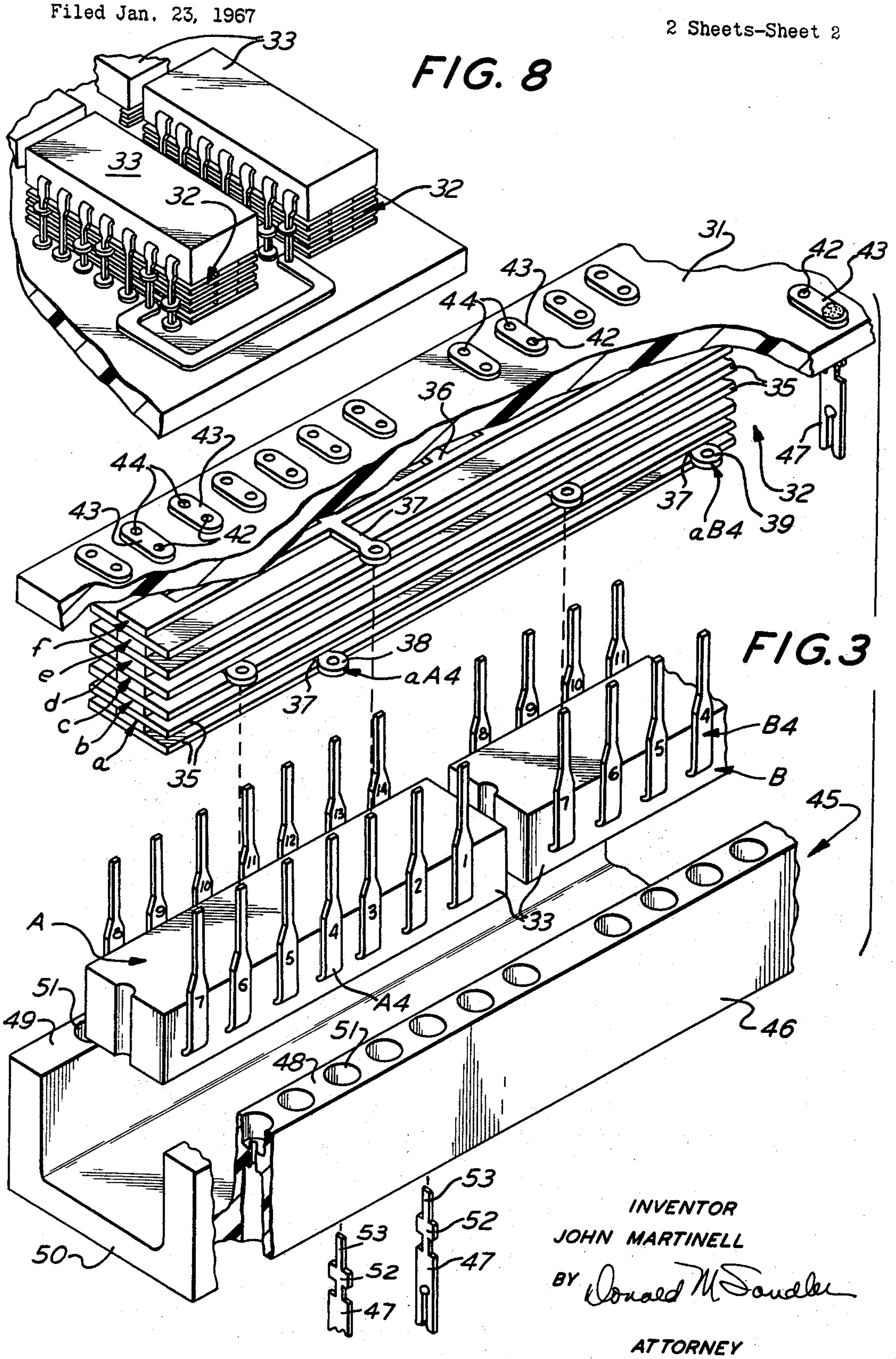
FIG. 3 is an exploded perspective view of a connector utilizing the module shown in FIG. 2.

FIG. 4*a* shows modification of the connection means for the comb shown in FIG. 4;

FIG. 5 is a plan view of the combs after they have been modified for the purpose of effecting the interconnections indicated in the circuit diagram of FIG. 1;

FIG. 6 is an end view of a dual-in-line package showing the interconnection matrix mounted between the body of the dual-in-line package and a printed circuit board;

FIG. 7 is an end view of a dual-in-line package showing the latter mounted in a printed circuit board, and the interconnection matrix affixed to the free ends of the leads of the dual-in-line package;

FIG. 8 is a perspective view showing a plurality of dual-in-line packages with interconnecting matrices mounted on a printed circuit board having conductive tracks for providing the interconnections between various rows of dual-in-line packages; and FIG. 9 is an end view, partially in section, showing a dual-in-line package mounted on a connector block and showing the interconnection matrix attached to the contact tails of the socket.

The present invention is applicable to a single D-I-P that requires internal interconnections, as well as to groups of D-I-P's that require internal and external interconnections. For practical reasons, it has been found that a module composed of five end-wise aligned D-I-P's is convenient to handle due to its size, and is capable of performing significant logical operations due to the variety of active circuits available in D-I-P's. It is for these reasons that the present invention is embodied in a five-D-I-P module, and it should be understood that the invention is applicable to fewer or more D-I-P's and to innumerable logical operations other than those disclosed herein.

Referring now to FIG. 1, reference numeral 20 designates a logic circuit comprising a driver unit in the form of D-I-P A, a modulo eight counter in the form of D-I-P's B, C, and D, and a decoder in the form of D-I-P E, all of which provides an output signal each time the counter reaches a count of seven. Each D-I-P has fourteen leads numbered consecutively around the periphery of the body of the D-I-P as shown in FIG. 2, the leads being arranged seven on a side to define two parallel rows of leads as shown in FIG. 3. A particular lead is designated by the identity of the D-I-P and the location of the lead on the periphery of the body. For example, the Symbol A1 means the first lead on D-I-P A.

D-I-P A contains an integrated circuit that includes input driver-amplifier 21 and at least three output buffer-amplifiers 22, 23, and 24. The pulsed input to the system is applied via lead A1, and the level outputs are taken from leads A5, A10, and A12. The power and ground leads for this and the other D-I-P's are at lead locations 4 and 11 respectively, and while not shown in FIG. 1, the interconnection matrix provides a common power and a common ground connection for all of the D-I-P's.

Each of D-I-P's B, C, and D contains an integrated circuit having sufficient logic to operate as a toggle flip-flop, which is to say that the state of the flip-flop (determined by the voltage level at lead position 7) is changed each time the voltage level at lead position 10 changes in a predetermined direction.

D-I-P E contains an integrated circuit that includes at least one AND-gate 25 and at least one inverter 26, the voltage level at lead E10 being "high" only when the flip-flops are in their ONE state (e.g., "high" voltages at leads B7, C7, and D7) established by the "high" voltage level at leads E6, E7, and E8.

From inspection of FIG. 1, it can be seen that there are exactly ten common connections (e.g., connections involving two or more leads):

| Item | Common connection | Item | Common connection |
|---|---|---|---|
| 1 | A3, B10 | 6 | C1, C14. |
| 2 | A6, B7, B8, C10, E6 | 7 | D1, D14. |
| 3 | A8, C7, C8, D10, E7 | 8 | E1, E10. |
| 4 | A13, D7, D8, E8 | 9 | A4, B4, C4, D4, E4 (power). |
| 5 | B1, B14 | 10 | A11, B11, C11, D11, E11 (ground). |

Note that a particular lead of a particular D-I-P can appear only once in the chart.

It is the function of the interconnection matrix of the present invention to provide these common connections in an extremely efficient manner.

Referring now to FIG. 2, reference numeral 30 designates a module comprising the five D-I-P's, A, B, C, D, and E mounted in end-wise alignment on insulated mounting board 31, with the interconnection matrix 32 being sandwiched between the body 33 of each D-I-P and board 31. The leads on the five D-I-P's establish a plurality of conductors arranged in two longitudinal parallel rows, and matrix 32 provides the common connections identified in the above chart.

As can be seen best in FIG. 3, matrix 32 comprises six overlying layers of conductive strips *a, b, c, d, e,* and *f* interleaved with seven layers of non-conductive strips 35. Actually, both types of strips are quite thin, the conductive strips preferably being 0.003" thick Mylar tape. The thickness of the strips has been exaggerated in the drawings to facilitate illustration; and actually, a matrix with ten layers of conductive strips interleaved with eleven layers of non-conductive strips has a thickness about half that of the body 33 of a D-I-P.

Each conductive strip is planar and extends longitudinally between the two rows of leads of the aligned D-I-P's in a plane perpendicular to the leads. As shown in FIG. 3, each conductive strip has a central, longitudinally extending ribbon 36, and at least two projections 37 that extend transversely and integrally from ribbon 36. Ribbon 36 is preferably much wider than it is thick, and may be provided with openings to reduce interlayer capacitance. The projections 37 of a conductive strip are located at longitudinal places opposite the two particular D-I-P leads that are to be interconnected by such strip. For reference purposes, a particular projection is designated by identifying the strip having the projection, and the D-I-P lead opposite the projection. For example, projections *b*A4 and *b*B4 are two projections on strip *b* that are opposite leads A4 and B4 respectively.

The free end of each of the projections 37 is provided with connection means that mechanically and electrically engage a lead of a D-I-P and permit each conductive strip to be mounted within the two rows of leads in a plane perpendicular to the leads. The preferred form of connection means is an apertured tab 39 (see FIGS. 4 and 4*a*) which is coplanar with the projection 37. The tab 39, in one embodiment, has a closed circular aperture 40 into which the free end of a lead from a D-I-P can be inserted. Since no more than one projection can be opposite any lead, only one apertured tab 39 will ever have to be inserted over a lead, so that the closed nature of the aperture does not present a significant problem in assembling the matrix 32 onto the leads of the D-I-P. However, the tab 39 may be provided with an open aperture 41, if desired.

Only six conductive strips are required to achieve the ten common connections listed in the above chart, and these are shown in FIG. 5. Strip *a* provides the common connection of Item 9; strip *b* provides the common connection of Item 10; strip *c* provides the common connection of Item 2; strip *d* provides the common connection of Item 3; and strip *e* provides the common connection of Item 4. Strip *f*, cut at the places indicated provides the common connections of Items 1, 5, 6, 7, and 8. To facilitate preparation of the strips and to provide a universal basis for making any possible interconnection, the strips are prepared from conductive comb *x* having the general appearance like that shown in FIG. 4. That is to say, comb *x* has a central ribbon 36 and a projection 37 at each possible longitudinal position at which a lead on a D-I-P exists. For a five D-I-P module, the comb would have five groups of 14 projections, each group being arranged in seven opposing pairs of projections extending transversely on opposite sides of the ribbon. The spacing of the projections in a group matches the lead spacing on the D-I-P's, and the spacing between groups matches the spacing between the D-I-P's. It is preferred to have the spacing between the D-I-P's on integral multiple of the D-I-P lead spacing (0.100").

Strip *a* is prepared from comb *x* by removing all but projections *a*A4, *a*B4, *a*C4, *a*D4, and *a*E4, and is easily accomplished because the material of the comb is so thin. In FIG. 5, the projections that were removed from the comb to prepare strip *a* are shown in broken lines. The remaining strips are prepared in a similar manner, and the projections removed from the comb are not shown.

Assembly of matrix 32 is facilitated by providing a pressure-sensitive adhesive layer on the top and bottom surfaces of the non-conductive strips 35. Both adhesive layers are protected by removable backing (not shown); and the matrix can be built up by removing a backing from one side of a strip to expose the adhesive layer, and then pressing the first conductive strip onto the first non-conductive strip. After the backing is removed from one side of the second non-conductive strip, the latter is pressed, adhesive-side down, onto the first conductive strip now attached to the first non-conductive strip. The backing is then removed from the other side of the second non-conductive strip exposing the adhesive layer to permit the previously described operations to be repeated until the complete matrix is assembled. Note that when the matrix is completed, the apertured tabs project beyond the longitudinal edges of the non-conductive strips permitting the D-I-P's to be inserted into the apertures in the tabs. The use of a pressure-sensitive adhesive layer on the non-conductive strips facilitates the preparation of a strip like strip *f*, which must be severed at a particular location in order to achieve the desired interconnection. The required projections are first removed from a conductive strip, and the latter is then pressed onto a non-conductive strip. A transverse window segment of both strips is simultaneously removed at the required location, the segment being large enough to completely sever the ribbon of the conductive strip, but small enough to provide webs on the non-conductive strip which serve to maintain the positioning of the remainder of the conductive strip on the non-conductive strip.

After the matrix 32 has been assembled onto the leads of the aligned D-I-P's, the portions of the tabs projecting beyond the edges of the D-I-P leads can be dipped in a solder bath. By providing a tin-plating on the conductive strips, the solder will be drawn up into the aperture and thus achieve a soldered connection between each lead and the tab engaged, therewith, all without totally immersing the D-I-P in the solder bath.

Turning now to mounting board 31, which is also a part of module 30, the mounting board is provided with a first set of lead apertures 42 arranged in two parallel rows on centers that match the lead spacing of the D-I-P's when the latter are aligned and attached to their interconnection matrix.

To permit outside connections to be made, board 31 is provided with a second set of apertures 44 arranged in two parallel rows that lie between the first set of apertures and the longitudinal edges of the mounting board. One aperture 44 is laterally adjacent to each aperture 42; and conductive pads 43 printed on the bottom surface of board 31 interconnect adjacent pairs of apertures 42, 44.

Module 30 is completed when the stick of D-I-P's, to which matrix 32 is soldered, is assembled onto mounting board 31 by inserting the leads of the D-I-P's into the first set of apertures 42 on the side of the mounting board opposite to the side having pads 43 thereon, and then soldering the mounting board, pad-side down. Module 30 can then be made a part of a pluggable connector 45 which also includes insulator housing 46 and contacts 47. Housing 46, which has the same length as module 30, is U-shaped in cross-section with a pair of upstanding legs 48, 49 connected by web 50. The legs 48 and 49 have sufficient length and are so spaced that board 31 can rest on the free ends of the legs while the D-I-P's of the module are contained between the legs as shown in FIG. 3.

The legs 48 and 49 are also provided with a plurality of apertures 51 aligned with apertures 44 contained in board 31. Each contact 47, which is locked into an aperture 51 by means of a twist tab 52, has a tail portion 53 that projects beyond the free ends of legs 48 and 49 into an aperture 44 when board 31 rests on such free ends. After this insertion takes place, the soldering process previously described can be carried out to complete the assembly of pluggable connector 45. Contacts are placed in apertures 51 at those locations where a connection must be made externally to or from connector 45.

As indicated previously, module 30 is arranged so that matrix 32 is sandwiched between the bodies of the D-I-P's and the mounting board. Alternatively, the mounting board can be sandwiched between the matrix and the D-I-P's as shown in FIG. 7.

Instead of using a support like board 31 that is only wide enough to hold a single stick of D-I-P's and its interconnected matrix, it is possible to use a conventional plain or multi-layered printed circuit board as a support. This is shown in FIGS. 6 and 8, the interconnections between the D-I-P sticks being effected by the various conductive tracks or by wires. In this manner, a large number of logic operations can be mounted on a single printed circuit card.

Alternatively, the D-I-P's can be mounted in sockets and the interconnection matrix can be attached to the socket leads. This embodiment of the invention is shown in FIG. 9 where the socket is designated by reference numeral 60. Socket 60 comprises an insulator casing 61 having a plurality of socket contacts 62 positioned therein to receive the leads of a D-I-P. Each contact 62 has a tail 63 that projects from casing 61 in two parallel rows, permitting the matrix to be assembled and attached thereto rather than to the leads of the D-I-P's themselves.

What is claimed is:

1. In combination with at least one dual-in-line integrated circuit package having a plurality of leads extending from the body of the package in two parallel rows, an interconnection matrix comprising:

(a) at least two overlying longitudinally extending planar conductive strips positioned between the two rows of leads in a plane perpendicular thereto;

(b) a nonconductive strip interposed between the conductive strips for electrically insulating the latter;

(c) each conductive strip having a central longitudinally extending ribbon with at least two projections that extend transversely and integrally from the ribbon and lie in the same plane as the ribbon, the projections on each ribbon being located at longitudinal places opposite the two particular leads that are to be interconnected by each such strip, and (d) the free end of each projection having an apertured tab which is coplanar with the projection and which receives therein at least one lead of said package mounting the package to the matrix of strips within the two rows of leads.

2. The combination of claim 1 including a rigid mounting board of nonconductive material to which said leads are attached.

3. The combination of claim 2 wherein said matrix is sandwiched between the body of said dual-in-line package and said mounting board.

4. The combination of claim 2 wherein said mounting board is sandwiched between the body of said dual-in-line package and said matrix.

5. The combination of claim 3 wherein said rigid mounting board is provided with a plurality of individual conductive pads on the surface of the board opposite to the surface on which the matrix and dual-in-line package are mounted, said leads extending through said board and electrically engaging respective pads.

6. The combination of claim 5 including a contact associated with each pad, each contact having a mating portion and a tail portion, the tail portion of each contact being electrically connected to respective pads.

7. The combination of claim 6 including a U-shaped insulated housing having a pair of spaced upstanding legs terminating in free ends upon which said rigid board rests with said contacts projecting into apertures in said legs, and means for attaching the contacts to said connector.

8. The combination of claim 7 wherein the surface of the board upon which the matrix and dual-in-line package are mounted, rests on the free ends of said pair of upstanding legs of said housing.

References Cited

UNITED STATES PATENTS

| | | |
|---|---|---|
| 1,999,137 | 4/1935 | Flewelling. |
| 2,866,136 | 12/1958 | Coda et al. |
| 3,264,403 | 8/1966 | Erdle. |
| 3,323,023 | 5/1967 | Walker. |

OTHER REFERENCES

Eldre Components, Inc., "Laminated and Molded Bus Bars," Rec. U.S. Patent Office, Mar. 17, 1965, pp. 1–4.

ROBERT K. SCHAEFER, *Primary Examiner.*

DAVID SMITH, *Assistant Examiner.*

U.S. Cl. X.R.

174—72